United States Patent
Ha et al.

(10) Patent No.: US 9,280,182 B2
(45) Date of Patent: Mar. 8, 2016

(54) CHIP ON FILM PACKAGE AND DISPLAY DEVICE INCLUDING THE SAME

(71) Applicant: SAMSUNG ELECTRONICS CO., LTD., Suwon-Si, Gyeonggi-Do (KR)

(72) Inventors: Jeong-Kyu Ha, Hwaseong-si (KR); Kwan-Jai Lee, Yongin-si (KR); Jae-Min Jung, Seoul (KR); Kyong-Soon Cho, Goyang-si (KR); Na-Rae Shin, Yongin-si (KR); Kyoung-Suk Yang, Yongin-si (KR); Pa-Lan Lee, Daegu (KR); So-Young Lim, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 24 days.

(21) Appl. No.: 14/195,352

(22) Filed: Mar. 3, 2014

(65) Prior Publication Data

US 2014/0246687 A1    Sep. 4, 2014

(30) Foreign Application Priority Data

Mar. 4, 2013  (KR) .......................... 10-2013-0022604

(51) Int. Cl.
  *H01L 29/18*  (2006.01)
  *G06F 1/16*  (2006.01)
  *G06F 3/041*  (2006.01)
  *H01L 27/32*  (2006.01)

(52) U.S. Cl.
  CPC ............ *G06F 1/1643* (2013.01); *G06F 1/1626* (2013.01); *G06F 1/1637* (2013.01); *G06F 3/0412* (2013.01); *H01L 27/323* (2013.01); *H01L 27/3276* (2013.01); *H01L 2251/5338* (2013.01)

(58) Field of Classification Search
  CPC .............................. G06F 1/1626; G06F 1/1637
  USPC ............................................................ 257/88
  See application file for complete search history.

(56) References Cited

U.S. PATENT DOCUMENTS

| | | | |
|---|---|---|---|
| 7,205,909 | B2 | 4/2007 | Lee |
| 7,442,968 | B2 | 10/2008 | Kim et al. |
| 8,194,048 | B2 | 6/2012 | Oowaki |
| 2009/0050887 | A1 | 2/2009 | Kim et al. |
| 2010/0060601 | A1 | 3/2010 | Oohira |
| 2011/0108979 | A1 | 5/2011 | Nakagawa et al. |
| 2011/0115731 | A1 | 5/2011 | Kuwajima |
| 2011/0141042 | A1 | 6/2011 | Kim et al. |
| 2012/0098774 | A1 | 4/2012 | Abe et al. |

FOREIGN PATENT DOCUMENTS

| | | |
|---|---|---|
| JP | 2003-157148 | 5/2003 |
| KR | 0762700 | 9/2007 |
| KR | 0859804 | 9/2008 |

*Primary Examiner* — Douglas Menz
(74) *Attorney, Agent, or Firm* — F. Chau & Associates, LLC

(57) ABSTRACT

A chip on film package includes a flexible base film having a first surface and a second surface opposite to each other that includes at least one through hole therein, a plurality of wirings disposed on the first surface and the second surface of the base film, respectively, that include a first lead and a second lead connected to each other through the at least one through hole, and a display panel driving chip and a touch panel sensor chip, each mounted on any one of the first surface and the second surface of the base film, wherein at least one of the display panel driving panel and the touch panel sensor chip is electrically connected to the first and second leads.

20 Claims, 12 Drawing Sheets

CHIP ON FILM PACKAGE AND DISPLAY DEVICE INCLUDING THE SAME

CROSS-REFERENCE TO RELATED APPLICATIONS

This application claims priority under 35 U.S.C. §119 from Korean Patent Application No. 10-2013-0022604, filed on Mar. 4, 2013 in the Korean Intellectual Property Office (KIPO), and all the benefits accruing therefrom, the contents of which are herein incorporated by reference in their entirety.

BACKGROUND

1. Technical Field

Exemplary embodiments are directed to a chip on film package and a display device including the chip on film package. More particularly, exemplary embodiments are directed to a chip on film package connected to a display panel and a touch panel and a display device including the chip on film package.

2. Discussion of the Related Art

In recent years, mobile terminals that include a touch screen panel display device have been developed to decrease a weight and thickness thereof. In particular, a mobile terminal may include an active-matrix organic light-emitting diode (AMOLED) display device that has active matrix organic light emitting diodes.

An AMOLED display device may include an AMOLED display panel with a touch panel. Further, an AMOLED display device may include a display panel driving chip having AMOLED driver integrated circuits and a touch panel sensor chip having touch screen integrated circuits. A display panel driving chip may be connected to the display panel and a touch panel sensor chip may be connected to the touch panel. However, in manufacturing a display panel, the processes of mounting the display panel driving chip and mounting the touch panel sensor chip may be performed separately, thereby increasing the number of components and processes.

SUMMARY

Exemplary embodiments provide a chip on film package having a structure capable of reducing the number of components of a display device.

Exemplary embodiments provide a display device including the chip on film package.

According to exemplary embodiments, a chip on film package includes a flexible base film having a first surface and a second surface opposite to each other that includes at least one through hole therein, a plurality of wirings disposed on the first surface and the second surface of the base film, respectively, that include a first lead and a second lead connected to each other through the through hole, and a display panel driving chip and a touch panel sensor chip, each mounted on any one of the first surface and the second surface of the base film, wherein at least one of the display panel driving panel and the touch panel sensor chip is electrically connected to the first and second leads.

In exemplary embodiments, the chip on film package may further include a connect lead in the at least one through hole that may connect the first lead on the first surface to the second lead on the second surface.

In exemplary embodiments, touch panel sensor chip may be connected to a touch panel connected to the first surface of the base film, and the display panel driving chip may be connected to a display panel connected to the second surface of the base film.

In exemplary embodiments, the touch panel sensor chip may be mounted on the second surface of the base film, an end portion of the first lead may be connected to the touch panel, and an end portion of the second lead may be connected to the touch panel sensor chip.

In exemplary embodiments, the display panel driving chip may be mounted on the first surface of the base film, an end portion of the second lead may be connected to the display panel, and an end portion of the first lead may be connected to the display panel driving chip.

In exemplary embodiments, the chip on film package may further include at least one passive element mounted on any one of the first surface and the second surface of the base film.

In exemplary embodiments, the chip on film package may further include at least one connector mounted on any one of the first surface and the second surface of the base film.

In exemplary embodiments, the chip on film package may further include a compensating member surrounding at least one of the display panel driving chip and the touch panel sensor chip.

According to exemplary embodiments, a display device includes a display panel, a touch panel provided on the display panel, and a chip on film package that extends from the display panel and the touch panel and is flexible to cover a backside of the display panel. The chip on film package includes a flexible base film connected to the display panel and the touch panel that includes at least one through hole therein, a plurality of wirings disposed on a first surface and a second surface of the base film, respectively, that includes a first lead and a second lead connected to each other through the through hole, and a display panel driving chip and a touch panel sensor chip, each mounted on any one of the first surface and the second surface of the base film, wherein at least one of the display panel driving panel and the touch panel sensor chip is electrically connected to the first and second leads.

In exemplary embodiments, the touch panel may be connected to the first surface of the base film and the display panel may be connected to the second surface of the base film.

In exemplary embodiments, the display device may further include a main board disposed in back of the display panel that is connected to the chip on film package, and a frame that receives the main board, the chip on film package and the display panel.

In exemplary embodiments, the frame may include a receiving groove that receives at least one of the display panel driving chip and the touch panel sensor chip.

In exemplary embodiments, the display device may further include a window that covers the touch panel.

In exemplary embodiments, the display panel may include a flexible substrate and an organic light emitting display device on the flexible substrate.

According to exemplary embodiments, a display device includes a flexible base film having a first surface and a second surface opposite to each other that includes a plurality of through holes therein, a display panel driving chip and a touch panel sensor chip, each mounted on any one of the first surface and the second surface of the base film, a touch panel connected to the first surface of the base film and a display panel connected to the second surface of the base film, and a plurality of wirings disposed on the first surface and the second surface of the base film, respectively, that connect the touch panel to the touch panel sensor chip, and connect the display panel to the display panel driving chip.

In exemplary embodiments, the plurality of wirings comprise a first lead on the first surface and a second lead on the second surface connected to each other by a first connection lead in at least one of the plurality of through holes.

In exemplary embodiments, the display panel may include a third lead on the second surface, wherein the touch panel sensor chip is disposed on the second surface, the first lead connects the touch panel to the first connection lead and the second lead connects the first connection lead to the touch panel sensor chip, the display panel driving chip is disposed on the second surface, and the third lead connects the display panel to the display panel driving chip.

In exemplary embodiments, the display panel may include a third lead on the first surface, wherein the display panel driving chip is disposed on the first surface, the second lead connects the display panel to the first connection lead and the first lead connects the first connection lead to the display panel driving chip, the touch panel sensor chip is disposed on the first surface, and the third lead connects the touch panel to the touch panel sensor chip.

In exemplary embodiments, the display panel may include a third lead on the second surface, wherein the display panel driving chip is disposed on the second surface and the third lead connects the display panel to the display panel driving chip, wherein the touch panel sensor chip is disposed on the first surface, the first lead connects the touch panel to the first connection lead, the second lead connects the first connection lead to a second connection lead in at least one of the plurality of through holes, and the second connection lead is connected to the touch panel sensor chip on the first surface.

In exemplary embodiments, the display panel may include a main board disposed behind the display panel, wherein the plurality of wirings comprise a fourth lead and a fifth lead on either of the first surface or the second surface that respectively connect the display panel driving chip and the touch panel sensor chip to the main board.

According to exemplary embodiments, a touch panel sensor chip and a display panel driving chip may be mounted on any one of opposing first and second surfaces of a flexible base film and be electrically connected to a touch panel and a display panel by wirings on the base film. At least one of the touch panel sensor chip and the display panel may be electrically connected to first and second leads that are formed on both surfaces of the base film, respectively, that are connected to each other through a hole that penetrates the base film.

Accordingly, a touch panel sensor chip and a display panel driving chip may be mounted at a desired position in one chip-on-film package. Further, passive elements may be also mounted in the chip-on-film package. Thus, the number of components for a display device may be reduced and freedom of design for a display device may be improved.

DETAILED DESCRIPTION OF EXEMPLARY EMBODIMENTS

Figure 1:
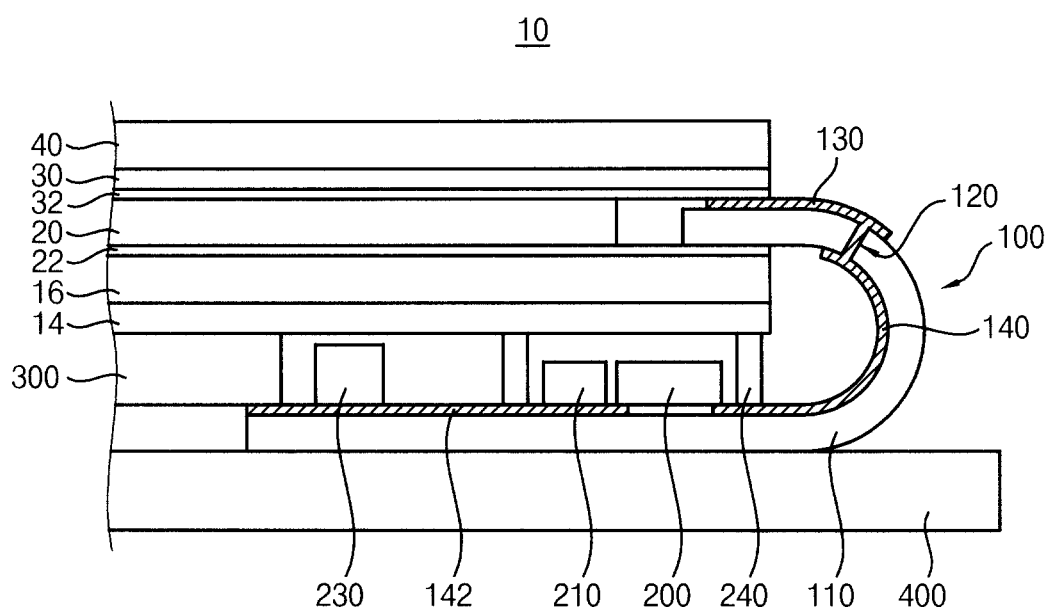
FIG. 1 is a side view of a display device in accordance with exemplary embodiments.

Various exemplary embodiments will be described more fully hereinafter with reference to the accompanying drawings, in which exemplary embodiments are shown. Exemplary embodiments may, however, be embodied in many different forms and should not be construed as limited to exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals refer to like elements throughout.

Hereinafter, example embodiments will be explained in detail with reference to the accompanying drawings.

Figure 2:
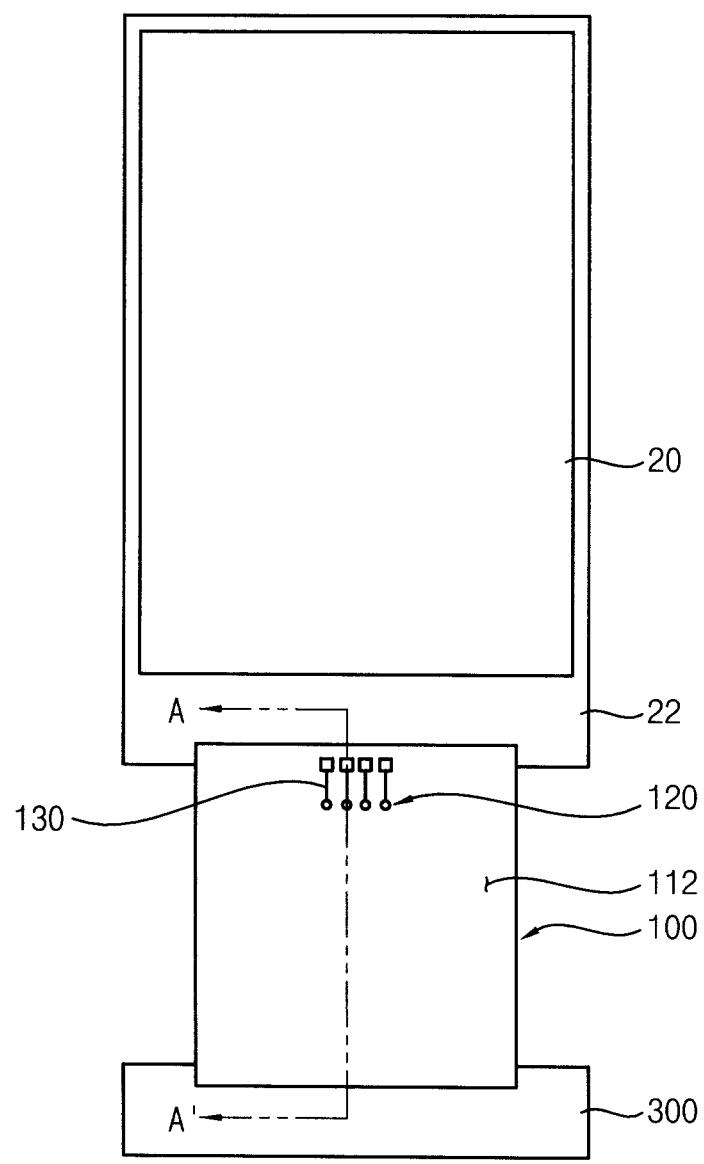
FIGS. 2 and 3 are plan views of a chip on film package of the display device in FIG. 1.
Figure 3:
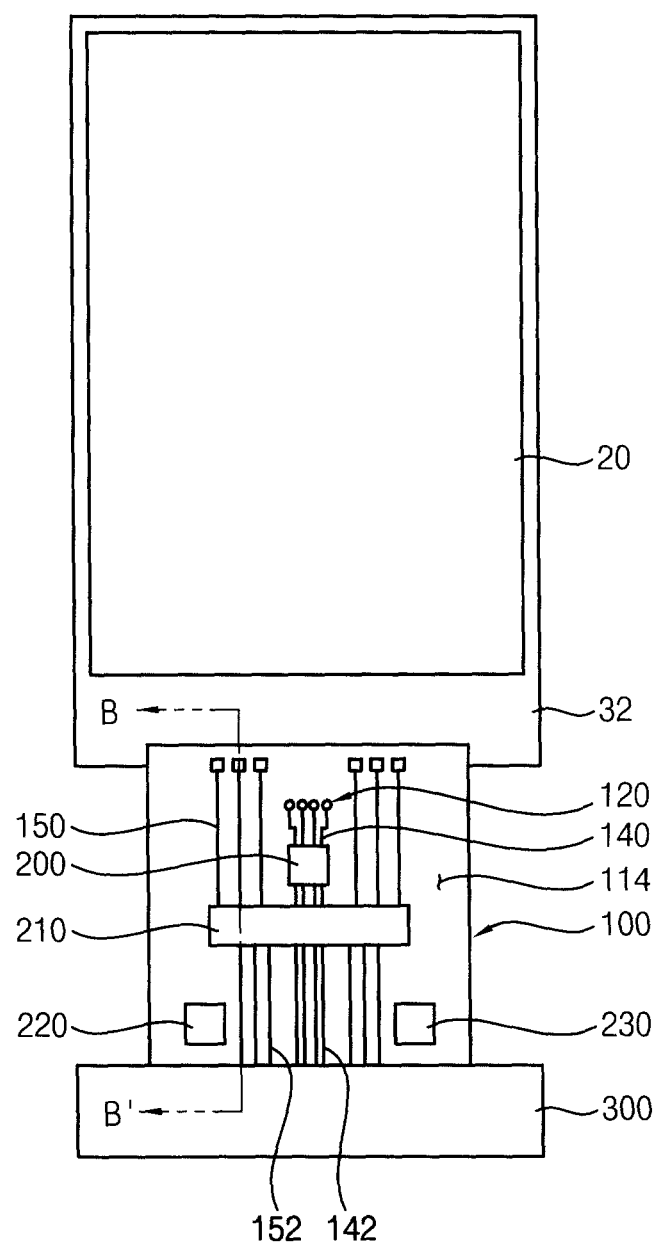
Figure 4:
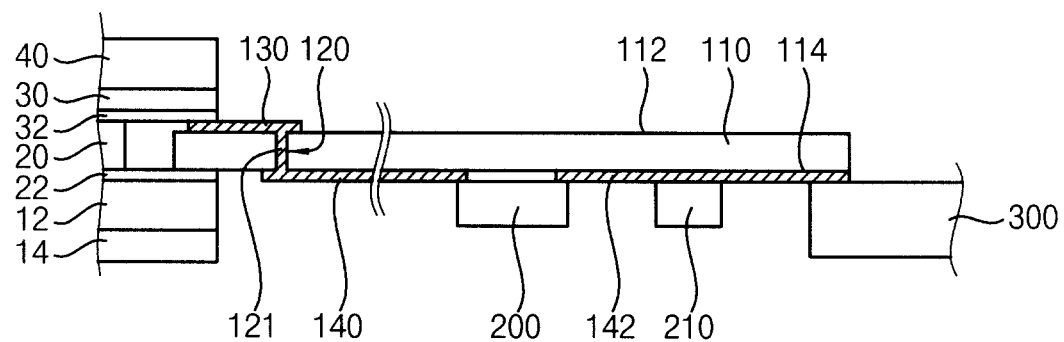
FIG. 4 is a cross-sectional view taken along line A-A' in FIG. 2.
Figure 5:
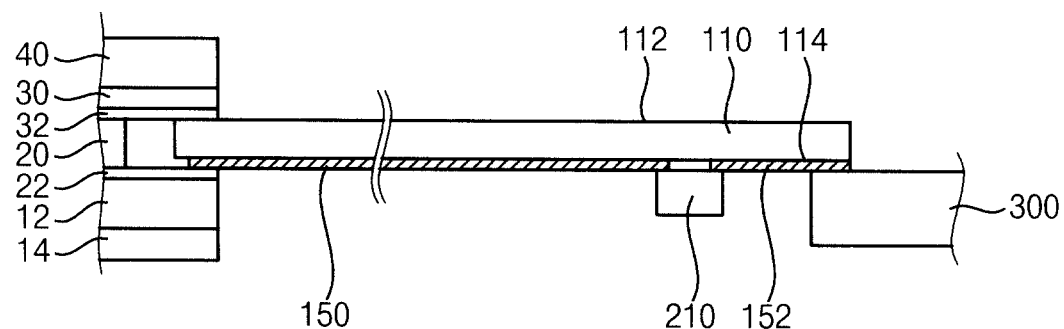
FIG. 5 is a cross-sectional view taken along line B-B' in FIG. 3.

FIG. 1 is a side view of a display device in accordance with exemplary embodiments. FIGS. 2 and 3 are plan views of a chip on film package of the display device in FIG. 1. FIG. 4 is a cross-sectional view take along the line A-A' in FIG. 2. FIG. 5 is a cross-sectional view taken along the line B-B' line in FIG. 3. FIG. 2 represents a first surface of a base film of the chip on film package and FIG. 3 represents a second surface of the base film of the chip on film package.

Referring to FIGS. 1 to 5, a display device 10 may include a display panel 20 with a touch panel 30 attached thereto, and a chip on film package 100 connected to the display panel 20 and the touch panel 30 that includes a touch panel sensor chip 200 and a display panel driving chip 210 mounted therein.

In exemplary embodiments, the display device 10 may be a flexible display device, and the display panel 20 may be an organic light emitting display device. The display panel 10 may further include a main board 300 connected to the chip on film package 100 and a frame for receiving the main board 300.

The display panel 20 may be disposed on a flexible substrate 16, and the display panel 20 may include an organic light emitting. A protective film 14 may be disposed on a lower surface of the flexible substrate 16 to absorb impacts on the display panel 20. The display panel 20 may include a first circuit layer 22. The display panel 20 may be connected to the chip on film package 100 via connection pads of the first circuit layer 22.

The flexible substrate 16 may include a plastic material. Examples of a plastic material include polyethersulphone (PES), polyacrylate (PAR), polyetherimide (PEI), polyethyelenen napthalate (PEN), polyethyelene terepthalate (PET), polyphenylene sulfide (PPS), polyallylate, polyimide, polycarbonate (PC), cellulose triacetate (TAC), cellulose acetate propionate, (CAP), etc.

The touch panel 30 may be disposed on the display panel 20. The touch panel 30 may be a capacitive type touch panel. The touch panel 30 may include a second circuit layer 32. The touch panel 30 may be connected to the chip on film package 100 via connection pads of the second circuit layer 32. The second circuit layer 32 may serve as an encapsulation layer to seal the organic light emitting display device of the display panel 20.

A window 40 may be disposed on the touch panel 30. The window 40 may protect the display panel 20 and allow an image from the display panel 20 to be displayed to a viewer.

In exemplary embodiments, the chip on film package 100 may include a flexible base film 110. The base film 110 may have a first surface 112 and a second surface 114 opposite to each other. The base film may include a flexible material such as polyimide, polycarbonate, etc. A plurality of wirings may be disposed on the first surface 112 and the second surface 114 of the base film 110.

The touch panel sensor chip 200 may be mounted on any one of the first surface 112 and the second surface 114 of the base film 110 and may be electrically connected to the touch panel 30 by the wirings. The display panel driving chip 210 may be mounted on any one of the first surface 112 and the second surface 114 of the base film 110 and may be electrically connected to the display panel 20 by wirings.

As illustrated in FIGS. 1 to 5, the touch panel sensor chip 200 may be mounted on the second surface 114 of the base film 110. The display panel driving chip 210 may be mounted on the second surface 114 of the base film 110.

A first end portion of the chip on film package 100 may be connected to the touch panel 30 and the display panel 20. A second end portion of the chip on film package 100 may be connected to the main board 300. The touch panel 30 may be connected to the first surface 112 of the base film 110 and the display panel 20 may be connected to the second surface 114 of the base film 110. The chip on film package 100 may be bent to surround a side portion of the display panel 20 and to cover a backside of the display panel 20. Accordingly, the first surface 112 of the base film 110 may face the backside of the display panel 20 and the second surface 114 of the base film 110 may face a frame 400.

The base film 110 may have at least one through hole. A first connection lead 121 may be disposed in a first through hole 120 to connect the wirings that are disposed on the first surface 112 and the second surface 114 respectively. The touch panel sensor chip 200 and the display panel driving chip 210 may be electrically connected to the wirings that are connected through the first through hole 120.

A first lead 130 may be disposed on the first surface 112 of the base film 110. The first lead 130 may extend from the first end portion of the base film 110 to the first through hole 120 in a first direction along which the base film 110 extends. A connection pad may be disposed in a first end portion of the first lead 130. The connection pad of the first lead 130 may be connected to the connection pad of the touch panel 30 by the second circuit layer 32. A second end portion of the first lead 130 may be connected to the first connection lead 121.

A second lead 140 may be disposed on the second surface 114 of the base film 110. The second lead 140 may extend from the first through hole 120 to the touch panel sensor chip 200 in the first direction. A first end portion of the second lead 140 may be connected to the first connection lead 121 and a second end portion of the second lead 140 may be connected to a connection pad of the touch panel sensor chip 200 by a connection member such as a bump.

Accordingly, the first lead 130 and the second lead 140, which are connected to each other through the first through hole 120, may serve as a first input wiring portion of the touch panel sensor chip 200 such that the touch panel sensor chip 200 may be electrically connected to the touch panel 30.

A first output wiring 142 may be disposed on the second surface 114 of the base film 110. The first output wiring 142 may extend from the touch panel sensor chip 200 to the main board 300 in the first direction. A first end portion of the first output wiring 142 may be connected to a connection pad of the touch panel sensor chip 200 by a connection member such as a bump. A connection pad may be disposed in a second end portion of the first output wiring 142. The connection pad of the first output wiring 142 may be connected to a connection pad of the main board 300 by a connection member such as a bump or an isotropic conductive film.

Accordingly, the first output wiring 142 may serve as a first output wiring portion of the touch panel sensor chip 200 such that the touch panel sensor chip 200 may be electrically connected to the main board 300.

A second input wiring 150 may be disposed on the second surface 114 of the base film 110. The second input wiring 150 may extend from the first end portion of the base film 110 to the display panel driving chip 210 in the first direction. A connection pad may be disposed in a first end portion of the second input wiring 150. The connection pad of the second input wiring 150 may be connected to the connection pad of the display panel 20 by the first circuit layer 22. A second end portion of the second input wiring 150 may be connected to a connection pad of the display panel driving chip 210 by a connection member such as a bump.

Accordingly, the second input wiring 150 may serve as a second input wiring portion such that the display panel driving chip 210 may be electrically connected to the display panel 20.

A second output wiring 152 may be disposed on the second surface 114 of the base film 110. The second output wiring 152 may extend from the display panel driving chip 210 to the main board 300 in the first direction. A first end portion of the second output wiring 152 may be connected to a connection pad of the display panel driving chip 210 by a connection member such as a bump. A connection pad may be disposed in a second end portion of the second output wiring 152. The connection pad of the second output wiring 152 may be connected to the connection pad of the main board 300 by a connection member such as a bump or an isotropic conductive film.

Accordingly, the second input wiring 152 may serve as a second output wiring portion of the display panel driving chip 210 such that the display panel driving chip 210 may be electrically connected to the main board 300.

As illustrated in FIG. 1, the chip on package 100 may further include a compensating member 240 that surrounds the touch panel sensor chip 200 and the display panel driving chip 210. The compensating member 240 may be disposed between the second surface 114 of the base film 110 and the backside of the display panel 20. The compensating member 240 may surround the touch panel sensor chip 200 and the display panel driving chip 210 on the second surface 114 of the base film 110 to protect them from an external impact. Accordingly, the compensating member 240 may provide a space for receiving the touch panel sensor chip 200 and the display panel driving chip 210.

The chip on film package 100 may further include a connector 220 mounted on the second surface 114 of the base film 110. The connector may receive a signal. The chip on film package 100 may further include a passive element 230 mounted on the second surface 114 of the base film 110. The passive element 230 may include a resistor, a capacitor, etc.

As described above, the first and second leads 130 and 140 may be disposed on both surfaces of the base film 110 respectively and may be connected to each other through the first through hole 120, to serve as an input wiring portion for the touch panel sensor chip 200. Accordingly, the touch panel sensor chip 200 and the display panel driving chip 210 may be mounted at any desired position in one chip on film package 100.

Figure 6:
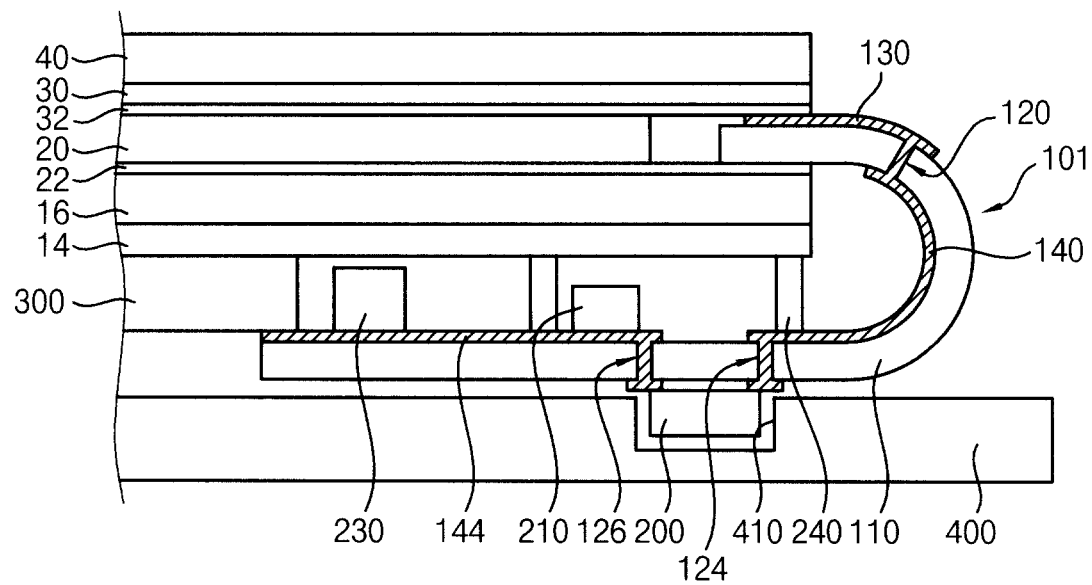
FIG. 6 is a side view of a display device in accordance with exemplary embodiments.
Figure 7:
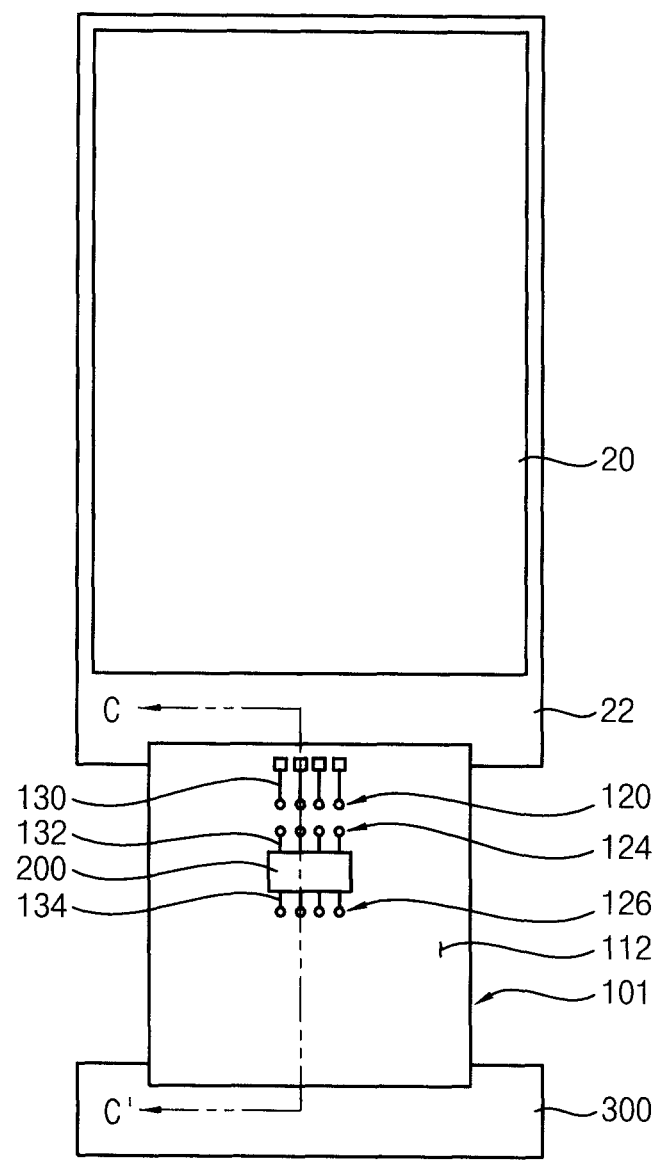
FIGS. 7 and 8 are plan views of a chip on film package of the display device in FIG. 6.
Figure 8:
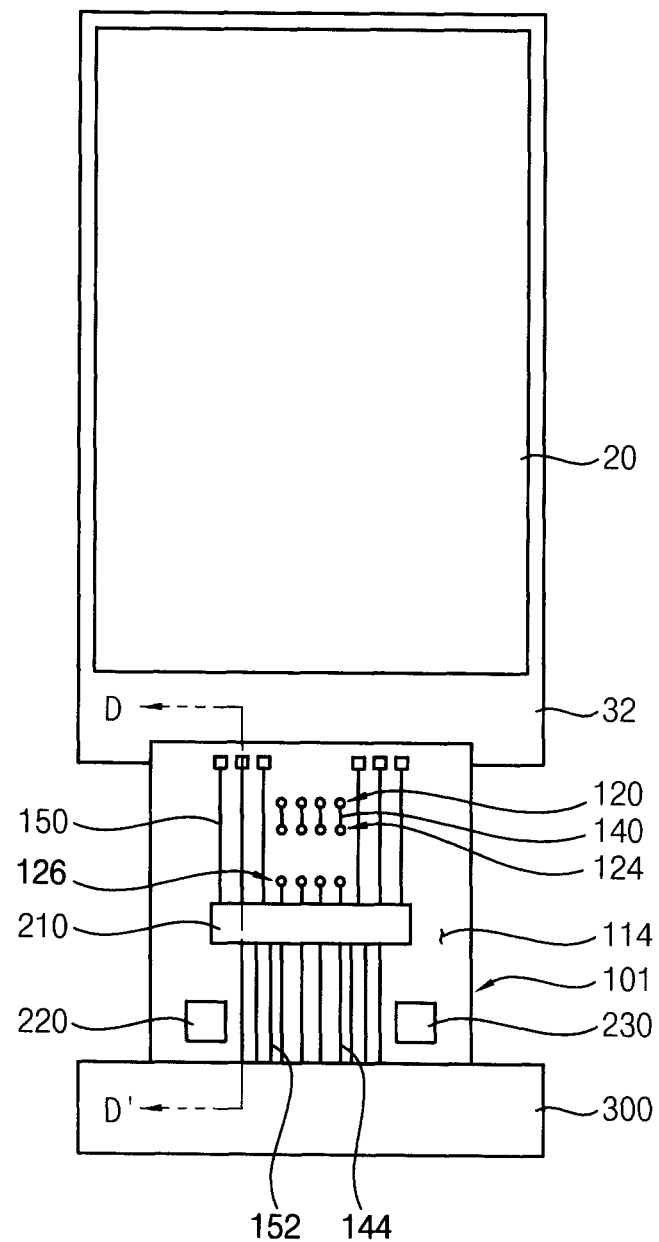
Figure 9:
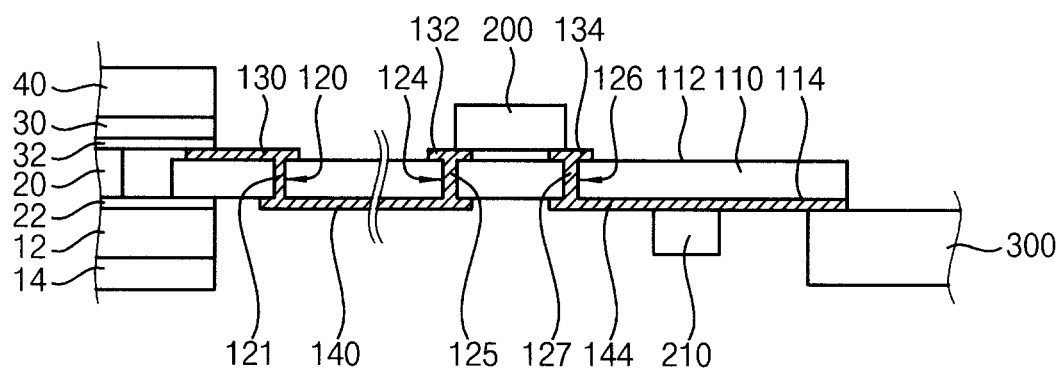
FIG. 9 is a cross-sectional view taken along the line C-C' in FIG. 7.
Figure 10:
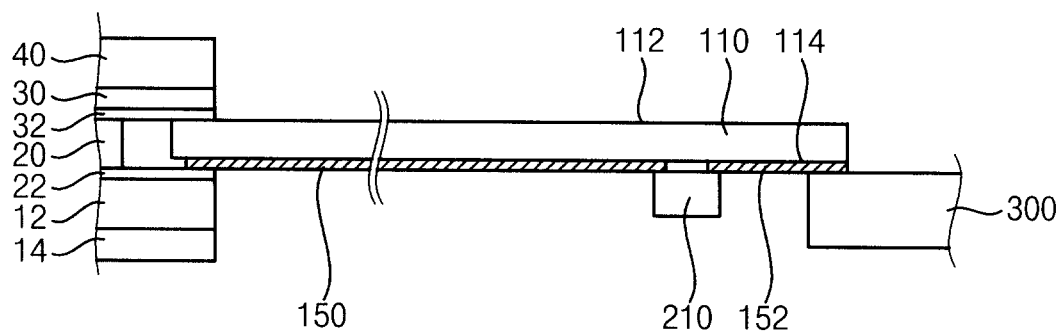
FIG. 10 is a cross-sectional view taken along the line D-D' in FIG. 8.

FIG. 6 is a side view of a display device in accordance with exemplary embodiments. FIGS. 7 and 8 are plan views of a chip on film package of the display device in FIG. 6. FIG. 9 is a cross-sectional view take along the line C-C' in FIG. 7. FIG. 10 is a cross-sectional view taken along the line D-D' line in FIG. 8. The display device may be substantially the same as or similar to the display device in FIG. 1, except for a chip on film package and a frame. Thus, the same reference numerals may refer to the same or like elements as those described in the display device of FIG. 1, and any further repetitive explanation concerning the above elements will be omitted.

Referring to FIGS. 6 to 10, a display device 11 may include a display panel 20 with a touch panel 30 attached thereto, and a chip on film package 101 connected to the display panel 20 and the touch panel 30 that includes a touch panel sensor chip 200 and a display panel driving chip 210 mounted therein.

The touch panel sensor chip 200 may be mounted on a first surface 112 of a base film 110. The display panel driving chip 210 may be mounted on a second surface 114 of the base film 110.

A first end portion of the chip on film package 101 may be connected to the touch panel 30 and the display panel 20. An second end portion of the chip on film package 101 may be connected to a main board 300. The touch panel 30 may be connected to the first surface 112 of the base film 110 and the display panel 20 may be connected to the second surface 114 of the base film 110.

A first lead 130 may be disposed on the first surface 112 of the base film 110. The first lead 130 may extend from the first end portion of the base film 110 to a first through hole 120 in a first direction in which the base film 110 extends. A connection pad may be disposed in a first end portion of the first lead 130. The connection pad of the first lead 130 may be connected to a connection pad of the touch panel 30 by the second circuit layer 32. A second end portion of the first lead 130 may be connected to a first connection lead 121 in the first through hole 120.

A second lead 140 may be disposed on the second surface 114 of the base film 110. The second lead 140 may extend from the first through hole 120 to a second through hole 124 in the first direction. A first end portion of the second lead 140 may be connected to the first connection lead 121 and a second end portion of the second lead 140 may be connected to a second connection lead 125 in the second through hole 124.

A third lead 132 may be disposed on the first surface 112 of the base film 110. The third lead 132 may extend from the second through hole 124 to the touch panel sensor chip 200 in the first direction. A first end portion of the third lead 132 may be connected to the second connection lead 125 and a second end portion of the third lead 132 may be connected to a connection pad of the touch panel sensor chip 200 by a connection member such as a bump.

Accordingly, the first lead 130, the second lead 140 and the third lead 132, which are connected to each other through the first and second through holes 120 and 124, may serve as a first input wiring portion of the touch panel sensor chip 200 such that the touch panel sensor chip 200 may be electrically connected to the touch panel 30.

A fourth lead 134 may be disposed on the first surface 112 of the base film 110. The fourth lead 134 may extend from the touch panel sensor chip 200 to a third through hole 126 in the first direction. A first end portion of the fourth lead 134 may be connected to the touch panel sensor chip 200 by a connection member such as a bump. A second end portion of the fourth lead 134 may be connected to a third connection lead 127 in the third through hole 126.

A fifth lead 144 may be disposed on the second surface 114 of the base film 110. The fifth lead 144 may extend from the third through hole 126 to the main board 300 in the first direction. A first end portion of the fifth lead 144 may be connected to the third connection lead 127. A connection pad may be disposed in a second end portion of the fifth lead 144. The connection pad of the fifth lead 144 may be connected to a connection pad of the main board 300 by a connection member such as a bump or an isotropic conductive film.

Accordingly, the fourth lead 134 and the fifth lead 144, which are connected to each other through the third through hole 126, may serve as a first output wiring portion of the touch panel sensor chip 200 such that the touch panel sensor chip 200 may be electrically connected to the main board 300.

A second input wiring 150 may be disposed on the second surface 114 of the base film 110. The second input wiring 150 may extend from the first end portion of the base film 110 to the display panel driving chip 210 in the first direction. A connection pad may be disposed in a first end portion of the second input wiring 150. The connection pad of the second input wiring 150 may be connected to the connection pad of the display panel 20 by the first circuit layer 22. A second end portion of the second input wiring 150 may be connected to a connection pad of the display panel driving chip 210 by a connection member such as a bump.

Accordingly, the second input wiring 150 may serve as a second input wiring portion of the display panel driving chip 210 such that the display panel driving chip 210 may be electrically connected to the display panel 20.

A second output wiring 152 may be disposed on the second surface 114 of the base film 110. The second output wiring 152 may extend from the display panel driving chip 210 to the main board 300 in the first direction. A first end portion of the second output wiring 152 may be connected to a connection pad of the display panel driving chip 210 by a connection member such as a bump. A connection pad may be disposed in a second end portion of the second output wiring 152. The connection pad of the second output wiring 152 may be connected to the connection pad of the main board 300 by a connection member such as a bump or an isotropic conductive film.

Accordingly, the second input wiring 152 may serve as a second output wiring portion of the display panel driving chip 210 such that the display panel driving chip 210 may be electrically connected to the main board 300.

As illustrated in FIG. 6, the chip on package 101 that extends from the display panel 20 and the touch panel 30 may be bent such that the chip on package 101 may partially cover a backside of the display panel 20. Accordingly, the first surface 112 of the base film 110 may face the backside of the display panel 20 and the second surface 114 of the base film 110 may face a frame 400.

The touch panel sensor chip 200 may be disposed on the first surface of the base film 110 of the chip package 101 to face the frame 400. The frame 400 may include a receiving groove 410 for receiving the touch panel sensor chip 200. Accordingly, the touch panel sensor chip 200 may be received in the receiving groove 410 of the frame 400, which may reduce the entire thickness of the display panel 11.

Figure 11:
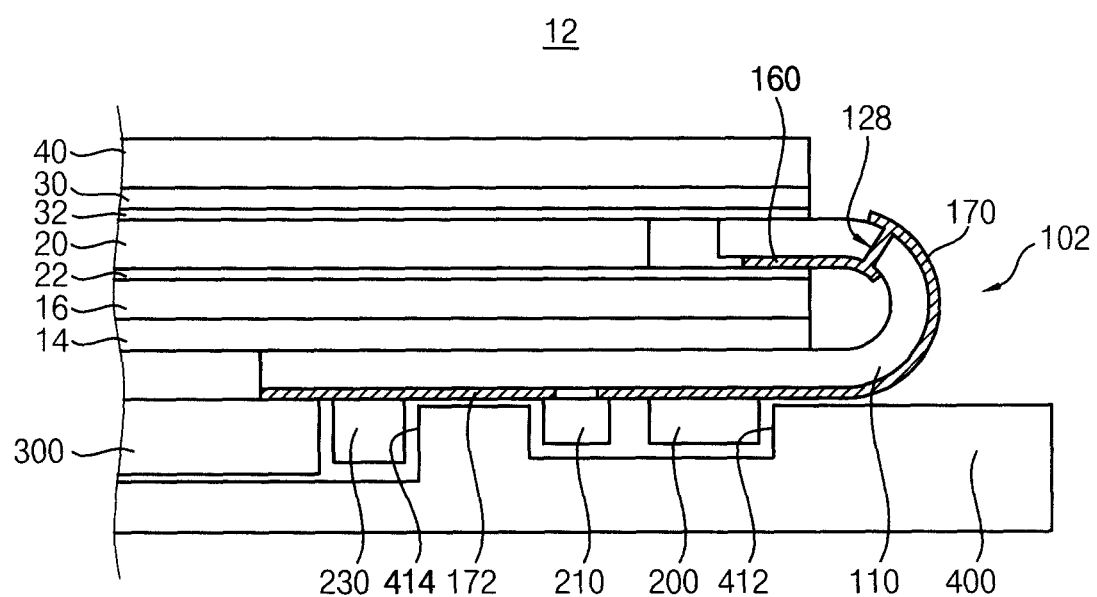
FIG. 11 is a side view of a display device in accordance with exemplary embodiments.
Figure 12:
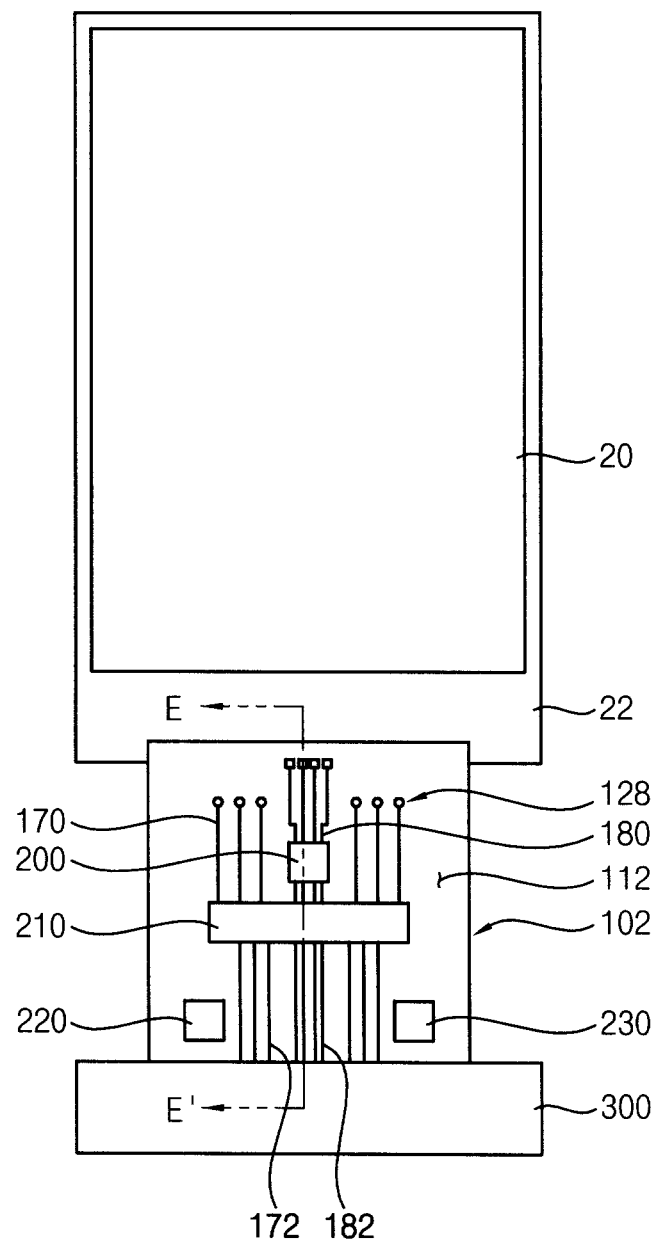
FIGS. 12 and 13 are plan views of a chip on film package of the display device in FIG. 11.
Figure 13:
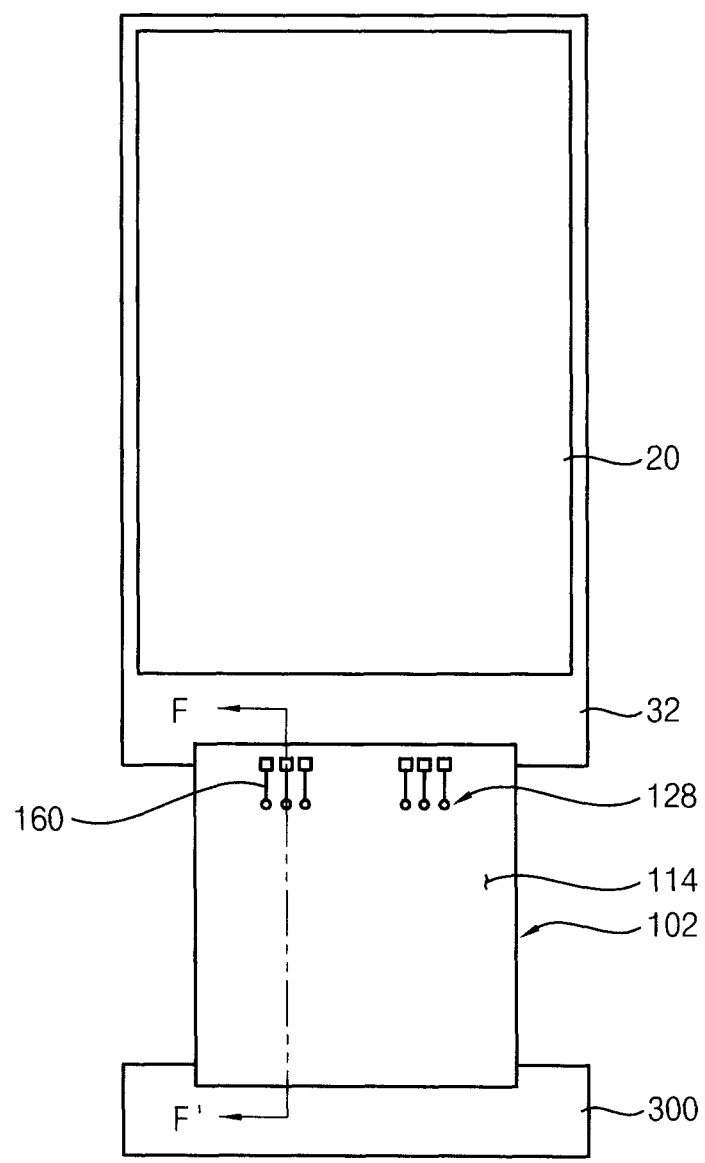
Figure 14:
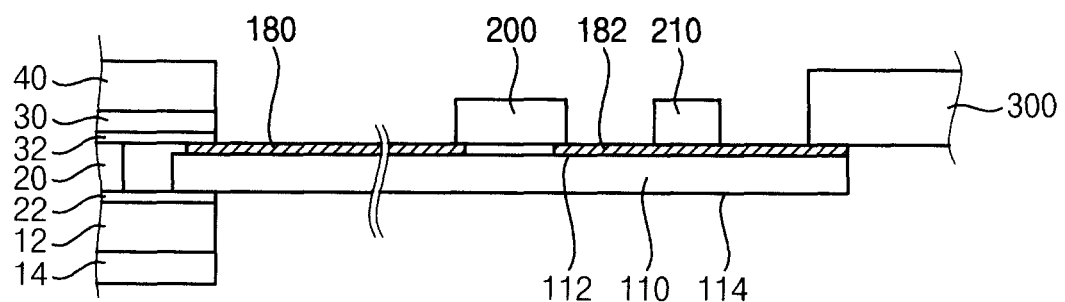
FIG. 14 is a cross-sectional view taken along the line E-E' in FIG. 12.
Figure 15:
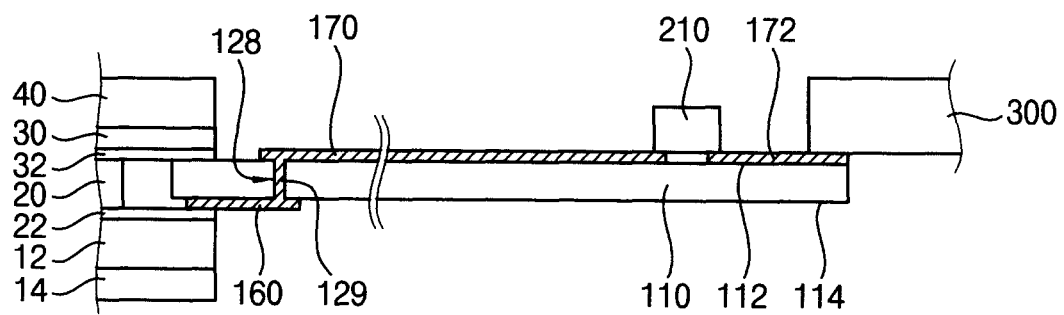
FIG. 15 is a cross-sectional view taken along the line F-F' in FIG. 13.

FIG. 11 is a side view of a display device in accordance with exemplary embodiments. FIGS. 12 and 13 are plan views of a chip on film package of the display device in FIG. 11. FIG. 14 is a cross-sectional view take along the line E-E' in FIG. 12. FIG. 15 is a cross-sectional view taken along the line F-F' line in FIG. 13. The display device may be substantially the same as or similar to the display device in FIG. 1, except for a chip on film package and a frame. Thus, the same reference numerals may be used to refer to the same or like elements as those described in the display device of FIG. 1, and any further repetitive explanation concerning the above elements will be omitted.

Referring to FIGS. 11 to 15, a display device 12 may include a display panel 20 with a touch panel 30 attached thereto, and a chip on film package 102 connected to the display panel 20 and the touch panel 30 that includes a touch panel sensor chip 200 and a display panel driving chip 210 mounted therein.

The touch panel sensor chip 200 may be mounted on a first surface 112 of a base film 110. The display panel driving chip 210 may be mounted on the first surface 112 of the base film 110.

A first end portion of the chip on film package 102 may be connected to the touch panel 30 and the display panel 20. A second end portion of the chip on film package 102 may be connected to a main board 300. The touch panel 30 may be connected to the first surface 112 of the base film 110 and the display panel 20 may be connected to a second surface 114 of the base film 110.

A first input wiring 180 may be disposed on the first surface 112 of the base film 110. The first input wiring 180 may extend from the first end portion of the base film 110 to the touch panel sensor chip 200 in a first direction in which the base film 110 extends. A connection pad may be disposed in a first end portion of the first input wiring 180. The connection pad of the first input wiring 180 may be connected to the connection pad of the touch panel 30 by the second circuit layer 32. A second end portion of the first input wiring 180 may be connected to a connection pad of the touch panel sensor chip 200 by a connection member such as a bump.

Accordingly, the first input wiring 180 may serve as a first input wiring portion of the touch panel sensor chip 200 such that the touch panel sensor chip 200 may be electrically connected to the touch panel 30.

A first output wiring 182 may be disposed on the first surface 112 of the base film 110. The first output wiring 182 may extend from the touch panel sensor chip 200 to the main board 300 in the first direction. A first end portion of the first output wiring 182 may be connected to a connection pad of the touch panel sensor chip 200 by a connection member such as a bump. A connection pad may be disposed in a second end portion of the first output wiring 142. The connection pad of the first output wiring 142 may be connected to a connection pad of the main board 300 by a connection member such as a bump or an isotropic conductive film.

Accordingly, the first output wiring 182 may serve as a first output wiring portion of the touch panel sensor chip 200 such that the touch panel sensor chip 200 may be electrically connected to the main board 300.

A sixth lead 160 may be disposed on the second surface 114 of the base film 110. The sixth lead 160 may extend from the first end portion of the base film 110 to a fourth through hole 128 in the first direction. A connection pad may be disposed in a first end portion of the sixth lead 160. The connection pad of the sixth lead 160 may be connected to a connection pad of the display panel 20 by a connection member such as bump or an isotropic conductive film. A second end portion of the sixth lead 160 may be connected to a fourth connection lead 129 in the fourth through hole 128.

A seventh lead 170 may be disposed on the first surface 112 of the base film 110. The seventh lead 170 may extend from the fourth through hole 128 to the display panel driving chip 200 in the first direction. A first end portion of the seventh lead 170 may be connected to the fourth connection lead 129 and a second end portion of the seventh lead 170 may be connected to a connection pad of the display panel driving chip 210 by a connection member such as a bump.

Accordingly, the sixth lead 160 and the seventh lead 170, which are connected to each other through the fourth through holes 128, may serve as a second input wiring portion of the display panel driving chip 210 such that the display driving chip 210 may be electrically connected to the display panel 20.

A second output wiring 172 may be disposed on the first surface 112 of the base film 110. The second input wiring 172 may extend from the display panel driving chip 210 to the main board 300 in the first direction. A first end portion of the second output wiring 172 may be connected to a connection pad of the display panel driving chip 210 by a connection member such as a bump. A connection pad may be disposed in a second end portion of the second output wiring 172. The connection pad of the second output wiring 172 may be connected to the connection pad of the main board 300 by a connection member such as a bump or an isotropic conductive film.

Accordingly, the second input wiring 172 may serve as a second output wiring portion of the display panel driving chip 210 such that the display panel driving chip 210 may be electrically connected to the main board 300.

As illustrated in FIG. 11, the touch panel sensor chip 200 and the display panel driving chip 210 may be disposed on the first surface 112 of the base film 110 of the chip package 102 to face the frame 400. The frame 400 may include a first receiving groove 412 for receiving the touch panel sensor chip 200 and the display panel driving chip 210.

A connector 220 and a passive element 230 may be disposed on the first surface 112 of the base film 110 to face the frame 400. The frame 400 may include a second receiving groove 414 for receiving the connector 220 and the passive element 230. According to embodiments, the passive elements may be disposed on both surfaces of the base film 110 respectively and the passive elements may be connected to each other by leads in through holes in the base film 110.

Accordingly, the touch panel sensor chip 200 and the display panel driving chip 210 may be received in the first receiving groove 412 of the frame 400. The connector 220 and the passive element 230 may be received in the second receiving groove 414 of the frame 400. Thus, the entire thickness of the display panel 12 may be reduced.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings of the present disclosure. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A chip on film package, comprising:
a flexible base film having a first surface and a second surface opposite to each other that includes at least one through hole therein;
a plurality of wirings disposed on the first surface and the second surface of the base film, respectively, that include a first lead and a second lead connected to each other through the through hole; and
a display panel driving chip and a touch panel sensor chip, each mounted on any one of the first surface and the second surface of the base film, wherein at least one of the display panel driving chip and the touch panel sensor chip is electrically connected to the first and second leads.

2. The chip on film package of claim 1, further comprising a connect lead in the at least one through hole that connects the first lead on the first surface to the second lead on the second surface.

3. The chip on film package of claim 1, wherein the touch panel sensor chip is connected to a touch panel connected to the first surface of the base film, and the display panel driving chip is connected to a display panel connected to the second surface of the base film.

4. The chip on film package of claim 3, wherein the touch panel sensor chip is mounted on the second surface of the base film, an end portion of the first lead is connected to the touch panel, and an end portion of the second lead is connected to the touch panel sensor chip.

5. The chip on film package of claim 3, wherein the display panel driving chip is mounted on the first surface of the base film, an end portion of the second lead is connected to the display panel, and an end portion of the first lead is connected to the display panel driving chip.

6. The chip on film package of claim 1, further comprising at least one passive element mounted on any one of the first surface and the second surface of the base film.

7. The chip on film package of claim 1, further comprising at least one connector mounted on any one of the first surface and the second surface of the base film.

8. The chip on film package of claim 1, further comprising a compensating member surrounding at least one of the display panel driving chip and the touch panel sensor chip.

9. A display device, comprising:
a display panel;
a touch panel provided on the display panel; and
a chip on film package that extends from the display panel and the touch panel and is flexible to cover a backside of the display panel, the chip on film package comprising:
a flexible base film connected to the display panel and the touch panel that includes at least one through hole therein;
a plurality of wirings disposed on a first surface and a second surface of the base film, respectively, that includes a first lead and a second lead connected to each other through the through hole; and
a display panel driving chip and a touch panel sensor chip, each mounted on any one of the first surface and the second surface of the base film, wherein at least one of the display panel driving panel and the touch panel sensor chip is electrically connected to the first and second leads.

10. The display device of claim 9, wherein the touch panel is connected to the first surface of the base film and the display panel is connected to the second surface of the base film.

11. The display device of claim 9, further comprising a main board disposed in back of the display panel that is connected to the chip on film package; and
a frame configured to receive the main board, the chip on film package and the display panel.

12. The display device of claim 11, wherein the frame comprises a receiving groove configured to receive at least one of the display panel driving chip and the touch panel sensor chip.

13. The display device of claim 9, further comprising a window that covers the touch panel.

14. The display device of claim 9, wherein the display panel comprises a flexible substrate and an organic light emitting diode (OLED) display panel on the flexible substrate.

15. A display device, comprising:
a flexible base film having a first surface and a second surface opposite to each other that includes a plurality of through holes therein;
a display panel driving chip and a touch panel sensor chip, each mounted on any one of the first surface and the second surface of the base film,
a touch panel connected to the first surface of the base film and a display panel connected to the second surface of the base film; and
a plurality of wirings disposed on the first surface and the second surface of the base film, respectively, that connect the touch panel to the touch panel sensor chip, and connect the display panel to the display panel driving chip.

16. The display device of claim 15, wherein the plurality of wirings comprise a first lead on the first surface and a second lead on the second surface connected to each other by a first connection lead in at least one of the plurality of through holes.

17. The display device of claim 16, further comprising a third lead on the second surface, wherein the touch panel sensor chip is disposed on the second surface, the first lead connects the touch panel to the first connection lead and the second lead connects the first connection lead to the touch panel sensor chip, the display panel driving chip is disposed on the second surface, and the third lead connects the display panel to the display panel driving chip.

18. The display device of claim 16, further comprising a third lead on the first surface, wherein the display panel driving chip is disposed on the first surface, the second lead connects the display panel to the first connection lead and the first lead connects the first connection lead to the display panel driving chip, the touch panel sensor chip is disposed on the first surface, and the third lead connects the touch panel to the touch panel sensor chip.

19. The display device of claim 16, further comprising a third lead on the second surface, wherein the display panel driving chip is disposed on the second surface and the third lead connects the display panel to the display panel driving chip, wherein the touch panel sensor chip is disposed on the first surface, the first lead connects the touch panel to the first connection lead, the second lead connects the first connection lead to a second connection lead in at least one of the plurality of through holes, and the second connection lead is connected to the touch panel sensor chip on the first surface.

20. The device of claim 15, further comprising a main board disposed behind the display panel, wherein the plurality of wirings comprise a fourth lead and a fifth lead on either of the first surface or the second surface that respectively connect the display panel driving chip and the touch panel sensor chip to the main board.

* * * * *